US007277299B2

(12) United States Patent
Yoshida

(10) Patent No.: US 7,277,299 B2
(45) Date of Patent: Oct. 2, 2007

(54) MULTI-DEVICE HOLDING STRUCTURE

(75) Inventor: Katsuyuki Yoshida, Osaka (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 0 days.

(21) Appl. No.: 10/893,043

(22) Filed: Jul. 16, 2004

(65) Prior Publication Data

US 2005/0046540 A1 Mar. 3, 2005

(30) Foreign Application Priority Data

Jul. 17, 2003 (JP) .............................. 2003-198174

(51) Int. Cl.
*H05K 7/12* (2006.01)

(52) U.S. Cl. ...................... 361/807; 361/809; 361/810; 257/718; 257/726; 257/727; 29/830

(58) Field of Classification Search ................ 361/704, 361/707, 709, 714, 717–719, 807–812; 257/704, 257/707, 706, 718–720, 723, 726, 727, 730, 257/678, 724; 29/830
See application file for complete search history.

(56) References Cited

U.S. PATENT DOCUMENTS 3,335,327 A * 8/1967 Damon et al. .............. 361/767
3,893,161 A * 7/1975 Pesak, Jr. ................... 257/718
4,252,390 A * 2/1981 Bowling ...................... 439/73
4,471,408 A * 9/1984 Martinez .................... 361/728
4,552,206 A * 11/1985 Johnson et al. ............ 165/80.3
5,108,299 A * 4/1992 Cronin ....................... 439/188
5,163,850 A * 11/1992 Cronin ....................... 439/507
5,287,001 A * 2/1994 Buchmann et al. ......... 257/719
5,381,041 A * 1/1995 Harmon ...................... 257/718
5,450,284 A * 9/1995 Wekell ....................... 361/710
5,562,489 A * 10/1996 Cronin ....................... 439/507
5,611,393 A * 3/1997 Vasconcelos et al. ...... 165/80.3
6,097,603 A * 8/2000 Edwards et al. ............ 361/719
6,104,612 A * 8/2000 Holland ...................... 361/704
6,465,728 B1 * 10/2002 McLaughlin et al. ...... 174/16.3

FOREIGN PATENT DOCUMENTS

JP 59-121144 8/1984
JP 63-124710 8/1988
JP 64-48047 3/1989

OTHER PUBLICATIONS

Japanese Office Action for Japanese patent application No. 2003-198174, issued Nov. 15, 2006, and English translation thereof, 3 pages.

* cited by examiner

*Primary Examiner*—Dean A. Reichard
*Assistant Examiner*—Dameon E. Levi
(74) *Attorney, Agent, or Firm*—Osha Liang LLP

(57) ABSTRACT

In a multi-device holding structure for integrally holding two heat generative elements which are transistors having through-holes so as to be mounted on a base plate, and a heat sensitive element which is a temperature fuse sandwiched between the heat sensitive elements and is mounted on the base plate, the heat generative elements and the heat sensitive element are covered with a metallic holding member provided with first flat spring segments for urging the heat generative elements on both ends as well as inserting segments extending upward and inserted into the through-holes, and second flat spring segments for supporting the sides of the heat sensitive element.

7 Claims, 2 Drawing Sheets

MULTI-DEVICE HOLDING STRUCTURE

BACKGROUND OF THE INVENTION

1. Field of the Invention

This invention relates to a multi-element holding structure for holding a plurality of elements mounted on a base plate, and more particularly to a multi-element holding structure for integrally holding a heat generative element and a heat sensitive capable of sensing heat generated by the heat generative element 2. Description of the Related Art Heat generative elements such as transistors mounted on a base plate, when they are excessively heated, may lead to thermal runway to be short-circuited, thereby adversely affecting electronic appliances. In order to obviate such an inconvenience, a heat-sensitive element such as a temperature fuse and temperature sensor capable of sensing the temperature of the heat-generative elements are mounted to be in intimate contact with the heat-generative elements and mounted on the base plate.

FIG. 5 is a sectional view showing a conventional multi-element holding structure for holding heat generative elements and a heat sensitive element. Mounted on a base plate 5 are heat-generative elements 2, 3 of transistors and a heat sensitive element 4 of a temperature fuse. The heat sensitive element 4 is sandwiched between the two heat generative elements 2, 3. The outer walls of the heat-generative elements 2, 3 are covered with a thermal compression tube 6.

The thermal compression tube 6 is made of heat-sensitive resin formed in a cylindrical shape. When the heat generative elements 2, 3 and heat sensitive element 4, after passed into the cylindrical thermal compression tube 6, are heated, the thermal compression tube 6 shrinks to be brought into intimate contact with the heat-generative elements 2, 3. Thus, the heat generative elements 2, 3 and the heat sensitive element 4 are integrally held. The heat sensitive element 4 kept in intimate contact with the heat generative elements 2, 3 is adapted to able to detect the temperature of the heat-generative elements 2, 3 accurately, as disclosed in JP-UM-A-64-48047.

However, the above conventional multi-element holding structure presented a problem of increasing the number of assembling man-hours because of necessity of heating the thermal compression tube 6. Further, if the width in a direction perpendicular to paper face of the heat-sensitive element 4 is narrower than that of the heat-generative elements 2, 3, the heat sensitive element 4 is prone to come off upward. This presented such a problem that packaging of the base plate after integration is not easy, thereby increasing the number of assembling man-hours.

SUMMARY OF THE INVENTION

An object of this invention is to provide a multi-element holding structure capable of reducing the number of man-hours.

In order to attain the above object, this invention provides a multi-device holding structure for integrally holding two heat generative elements which are transistors having through-holes so as to be mounted on a base plate, and a heat sensitive element which is a temperature fuse sandwiched between the heat sensitive elements and is mounted on the base plate, characterized in that the heat generative elements and the heat sensitive element are covered with a metallic holding member provided with first flat spring segments for urging the heat generative elements on both ends as well as inserting segments extending upward and inserted into the through-holes and second flat spring segments for supporting the sides of the heat sensitive element.

This invention also provides a multi-device holding structure for integrally holding two heat generative elements having through-holes so as to be mounted on a base plate, and a heat sensitive element sandwiched between the heat sensitive elements and mounted on the base plate, characterized in that the heat generative elements and the heat sensitive element are covered with a metallic holding member provided with first flat spring segments for urging the heat generative elements on both ends as well as inserting segments extending upward and inserted into the through-holes.

In accordance with this configuration, with the heat sensitive element sandwiched by two heat generative elements, if these elements are covered with the holding member from above, they are sandwiched by the first spring segments. The holding member is prevented from being removed in such a manner that the inserting segments extending upward and provided at the first spring segments are inserted into the through-holes of the heat generative elements.

This invention provides the multi-element holding member having the above configuration characterized in that the holding member has the second spring segments for supporting the sides of the heat sensitive element. In accordance with this configuration, both sides of the heat sensitive element is urged by the second flat spring segments so that the heat sensitive element is positioned in a horizontal direction.

Further, this invention provides a multi-element holding structure having the above configuration, characterized in that the holding member has upper supporting segments for supporting the upper part of the heat sensitive element by cutting-up. In accordance with this configuration, the heat sensitive element is brought into contact with the upper supporting segments formed by cutting-up so that the heat sensitive element is positioned in a vertical direction.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Figure 1:
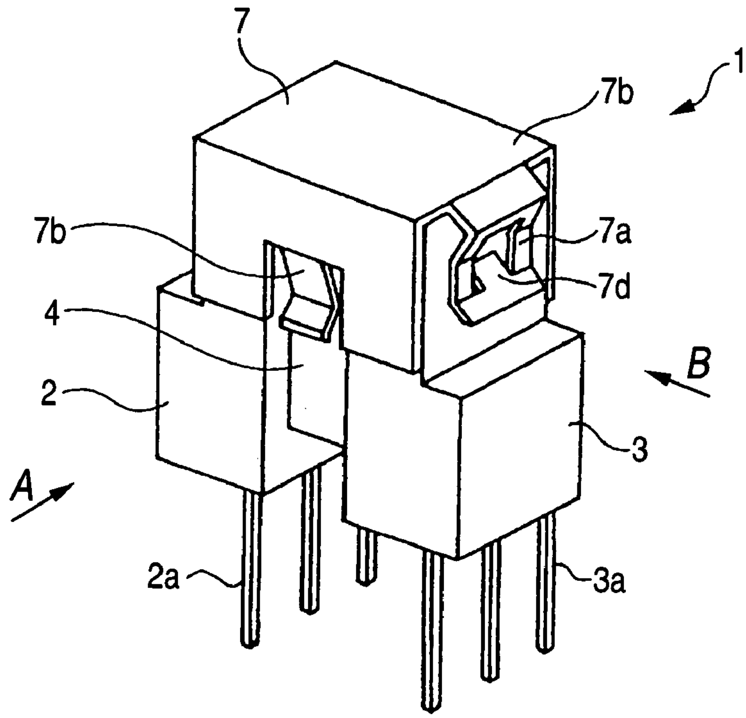
FIG. 1 is a perspective view showing a multi-element holding structure according to a first embodiment of this invention.
Figure 2:
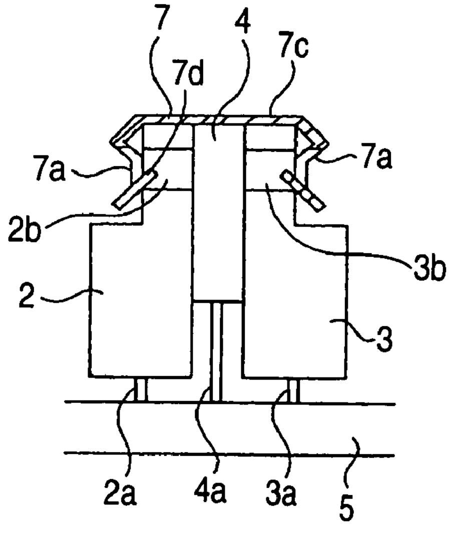
FIG. 2 is a sectional view showing a multi-element holding structure according to a first embodiment of this invention.
Figure 3:
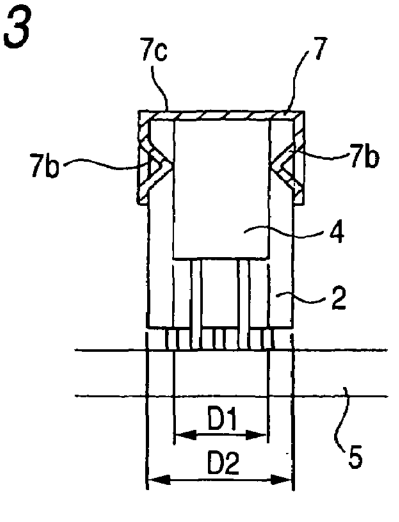
FIG. 3 is a sectional view showing a multi-element holding structure according to a first embodiment of this invention.
Figure 5:
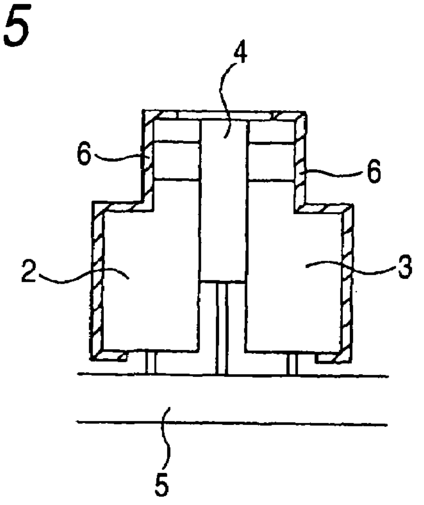
FIG. 5 is a perspective view showing a conventional multi-element holding structure.

Now referring to the drawings, an explanation will be given of embodiments of this invention. FIG. 1 is a perspective view of a multi-element holding structure according to the first embodiment of this invention. FIGS. 2 and 3 are sectional views taken in directions A and B, respectively. In these figures, for convenience of explanation, like reference symbols refer to like parts in FIG. 5 showing the prior art.

A multi-element holding structure 1 includes heat-generative elements 2, 3 of transistors and a heat-sensitive element 4 of a temperature fuse. The heat-sensitive element 4 is sandwiched between the two heat-generative elements 2, 3. The heat-generative elements 2, 3 have through-holes 2*b*, 3*b* (see FIG. 2) which permit these elements to be screw-secured. The heat-generative elements 2, 3 and the heat sensitive element 4 are mounted on the base plate 5 by terminals 2*a*, 3*a*, 4*a* arranged below these elements.

The heat-generative elements 2, 3 and heat sensitive element 4 are covered with a cap-like holding member 7 in their upper part. Thus, the upper face of the heat-generative elements 2, 3 and heat sensitive element 4 is in contact with the upper surface 7*c* of the holding member 7 so that they are positioned in their relative position in a vertical direction.

The holding member 7 is formed by metal-working a metallic plate. The holding member 7 has first flat spring segments 7*a* for urging the heat-generative elements 2, 3. The heat generative elements 2, 3 and heat sensitive element 4 are sandwiched by the first flat spring segments 7*a* so that these elements are held integrally. Thus, the heat sensitive element 4 is brought into contact with the heat generative elements 2, 3, thereby permitting the accurate temperature of the heat generative elements 2, 3 to be detected.

The first flat spring segments 7*a* each having an inserting segment 7*d* which extends in an upward-slanting direction and has a free end. The inserting segments 7*d* are inserted in the through-holes 2*b*, 3*b*. When the holding member 7 is pulled up, the inserting segments 7*d* are engaged in the upper portion of the through-holes 2*b*, 3*b*. Thus, the holding member 7 is not easily removed even if it suffers from force from above.

When the heat generative elements 2, 3 and heat sensitive element 4 are integrated, these elements are inserted into the holding member 7 in their superposed state so that they can be covered with the holding member 7. Otherwise, the one heat generative element 2 may be inserted into the holding member 7 so that the inserting segment 7*d* is engaged in the through-hole 2*b*, and thereafter the heat sensitive element 4 and the other heat generative element 3 may be inserted in the holding member 7 in their superposed state. This permits these elements to be covered with the holding member more easily.

Further, the holding member 7 has second flat spring segments 7*b* for urging the sides of the heat sensitive element 4. Thus, even where the width D1 of the heat sensitive element 4 is narrower than the width D2 of the heat generative elements 2, 3, the heat sensitive element 4 can be positioned in a horizontal direction.

In accordance with this embodiment, the heat generative elements 2, 3 and heat sensitive element 4 are sandwiched by the holding member 7 having the first flat spring segments 7*a* so that the heat generative elements 2, 3 and heat sensitive element 4 can be brought into intimate contact with each other to be integrated. This reduces the number of assembling man-hours. Further, the holding member 7 is prevented from being removed by the inserting segments 7*d* capable of being engaged in the through-holes 2*b*, 3*b*. This prevents the heat generative elements 2, 3 and the heat sensitive element 4 from being separated. Further, by the use of the upper face of the holding member 7, the heat generative elements 2, 3 and the heat sensitive element 4 are positioned in their relative position in the vertical direction so that they can be easily mounted on the base plate 5.

Figure 4:
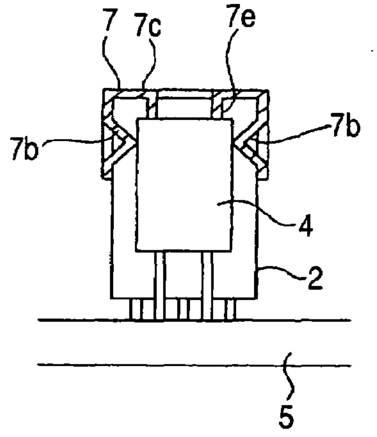
FIG. 4 is a perspective view showing a multi-element holding structure according to a second embodiment of this invention.

FIG. 4 is a sectional view showing a multi-element holding structure according to a second embodiment of this invention.

For convenience of explanation, in FIG. 4, like reference numerals refer to like parts in the first embodiment shown in FIGS. 1 to 3. This embodiment is different from the first embodiment in only that upper holding segments 7*e* are formed at the upper surface 7*c* of the holding member 4.

The upper supporting segments 7*e* are formed by cutting-up. The upper supporting segments 7*e* are brought into contact with the upper surface of the heat sensitive element 4 so that the heat sensitive element 4 is positioned in a vertical direction. Thus, without increasing the number of components, the heat sensitive element 4 can be located at a predetermined position relative to the heat generative elements 2, 3 according to the size of the heat sensitive element 4. Accordingly, the heat generative elements 2, 3 and the heat sensitive element 4 can be easily mounted on the base plate 5.

In the first and second embodiments, other semiconductor elements such as an IC may be adopted in place of the heat sensitive elements 2, 3. In place of the temperature fuse, a temperature sensor which can detect the temperature of the heat generative elements 2, 3 may be adopted as the heat sensitive element 4. Further, where the width D1 (FIG. 3) of the heat sensitive element is equal to the width D2 of the heat sensitive elements 2, 3, the second flat spring segments 7*b* can be done without.

In accordance with this invention, the heat generative elements and heat sensitive element are sandwiched by the holding member having the first flat spring segments so that the heat generative elements and heat sensitive element can be brought into intimate contact with each other to be integrated. This reduces the number of assembling man-hours. Further, the holding member is prevented from being removed by the inserting segments capable of being engaged in the through-holes. This prevents the heat generative elements and the heat sensitive element 4 from being separated. Further, by the use of the upper face of the holding member, the heat generative elements and the heat sensitive element are positioned in their relative position in the vertical direction so that they can be easily mounted on the base plate.

In accordance with this invention, since the holding member has second flat spring segments for urging the sides of the heat sensitive element. Thus, even where the width D1 of the heat sensitive element is narrower than the width of the heat generative elements, the heat sensitive element can be positioned in a horizontal direction.

In accordance with this invention, since the holding member has upper supporting segments for supporting the upper surface of the heat sensitive element by cutting up, without increasing the number of components, the heat sensitive element can be located at a predetermined position relative to the heat generative elements according to the size of the heat sensitive element.

What is claimed is:

1. A device comprising:

a pair of heat-generative elements;

a heat-sensitive element sandwiched between the pair of heat-generative elements; and a holding member configured to hold the pair of heat-generative elements and the heat sensitive element, wherein the holding member comprises first leaf spring segments facing each other and configured to urge the pair of the heat generative elements together.

2. The device according to claim 1 wherein the holding member further comprises second leaf spring segments configured to support sides of the heat-sensitive element.

3. The device according to claim 1 wherein the holding member further comprises an upper supporting segment configured to support an upper portion of the heat sensitive element.

4. The device according to claim 1 wherein each of the heat-generative elements has a through-hole, and each of the first leaf springs comprises an inserting segment configured to be inserted into a corresponding through-hole.

5. The device according to claim 2 wherein the second leaf spring segments are arranged to face each other in a direction perpendicular to a direction of urging the pair of the heat-generative elements.

6. A method for inserting a pair of heat-generative elements and a heat-sensitive element into a multi-element holding structure, comprising:

forming a holding member comprising an upper surface from a metallic plate;

forming first leaf spring segments from the metallic plate that are parallel to each other in planes perpendicular to the upper surface and adapted to urge the pair of the heat-generative elements toward the heat-sensitive element;

forming second leaf spring segments from the metallic plate that are cut from faces that are parallel to each other and perpendicular to the first leaf spring segments and the upper surface and adapted to support sides of the heat-sensitive element;

aligning the pair of heat-generative elements and the heat-sensitive element along an insertion axis perpendicular to a face of the upper surface; and inserting the pair of heat-generative elements and the heat-sensitive element into the multi-element holding structure, wherein the multi-element holding structure comprises the holding member, the first leaf spring segments, and the second leaf spring segments.

7. The method of claim 6 wherein the holding member is adapted to cover the pair of heat-generative elements and the heat-sensitive element.

* * * * *